US009247674B2

(12) United States Patent
Okamoto et al.

(10) Patent No.: US 9,247,674 B2
(45) Date of Patent: Jan. 26, 2016

(54) HEAT SINK AND ELECTRONIC APPARATUS PROVIDED WITH HEAT SINK

(71) Applicant: FUJITSU LIMITED, Kawasaki-shi, Kanagawa (JP)

(72) Inventors: Tomomi Okamoto, Yokohama (JP); Hiroshi Yamada, Sapporo (JP)

(73) Assignee: FUJITSU LIMITED, Kawasaki (JP)

( * ) Notice: Subject to any disclaimer, the term of this patent is extended or adjusted under 35 U.S.C. 154(b) by 414 days.

(21) Appl. No.: 13/937,239

(22) Filed: Jul. 9, 2013

(65) Prior Publication Data

US 2014/0036445 A1  Feb. 6, 2014

(30) Foreign Application Priority Data

Aug. 3, 2012 (JP) ................................. 2012-172883

(51) Int. Cl.
*H05K 7/20* (2006.01)
*H01L 23/473* (2006.01)
(Continued)

(52) U.S. Cl.
CPC ........ *H05K 7/20209* (2013.01); *H01L 23/4006* (2013.01); *H01L 23/473* (2013.01);
(Continued)

(58) Field of Classification Search
CPC .............. H01L 23/473; H01L 21/4882; H01L 23/4735; Y10T 29/4935; Y10T 29/49353; F28F 3/048; F28F 3/12; F28F 3/02; F28F 1/32; F28F 1/12; F28F 2009/0287; F28F 2215/02; F28F 2215/04; F28F 2215/10; F28F 2260/02; F28F 27/02; F28F 3/086; H05K 7/2039; H05K 7/20927; H05K 7/20263; H05K 7/20481; H05K 7/20518; H05K 7/20209; H05K 7/20281; H05K 1/0203; H05K 2201/066; H05K 7/20145; H05K 7/20254; H05K 7/20336; H05K 7/20154; G06F 1/20; G06F 2200/201; F28D 15/00; F28D 15/0275; F28D 15/02; F28D 2021/0028; F28D 15/04; F28D 2021/0029; F28D 15/043; F28D 1/0246; B23P 15/26; B23P 2700/09; B23P 2700/10
USPC ............ 361/697, 692, 679.54, 689, 702, 703, 361/709, 679.48, 679.52, 696, 699, 701, 361/704, 820; 257/706, E21.499, E23.08, 257/714; 29/890.032, 890.035; 324/762.01, 324/762.02
See application file for complete search history.

(56) References Cited

U.S. PATENT DOCUMENTS

| | | | | |
|---|---|---|---|---|
| 5,006,796 A | * | 4/1991 | Burton | ..... F25B 21/04 165/61 |
| 6,019,165 A | * | 2/2000 | Batchelder | ..... F25B 21/02 165/104.33 |

(Continued)

FOREIGN PATENT DOCUMENTS

| | | |
|---|---|---|
| JP | 59-098542 | 6/1984 |
| JP | 8-032262 | 2/1996 |

(Continued)

*Primary Examiner* — Hung S Bui
*Assistant Examiner* — Michael Matey
(74) *Attorney, Agent, or Firm* — Fujitsu Patent Center

(57) ABSTRACT

A heat sink for cooling a heat generating member, provided with a first cooling part which cools the peripheral edge part of the heat generating member and a second cooling part which cools the center part of the neat generating member, the first cooling part is equipped with a first base member having first fins on the top surface thereof and a recess at the bottom surface thereof, the second cooling part is equipped with a second base member which can be accommodated in the recess, a slide member which is provided on the top surface of the second base member and which is inserted in a through hole which is provided in the recess, second fins which are provided on the free end of the slide member, and a cooling water passage which is provided inside of the second base member and which is supplied with cooling water.

20 Claims, 10 Drawing Sheets

(51) Int. Cl.
*H01L 23/40* (2006.01)
*H01L 23/427* (2006.01)
*H01L 23/467* (2006.01)

(52) U.S. Cl.
CPC ............ H05K7/20281 (2013.01); *H01L 23/40* (2013.01); *H01L 23/427* (2013.01); *H01L 23/467* (2013.01); *H01L 2023/4056* (2013.01); *H01L 2924/0002* (2013.01)

(56) References Cited

U.S. PATENT DOCUMENTS

| | | | | |
|---|---|---|---|---|
| 7,551,439 B2 * | 6/2009 | Peugh | ................... | H01L 23/053 165/80.4 |
| 7,583,504 B2 * | 9/2009 | Aberg | ................ | H01L 23/4006 165/80.3 |
| 8,018,719 B2 * | 9/2011 | Busch | ................ | F28D 15/0233 165/104.33 |
| 8,375,584 B2 * | 2/2013 | Lin | ....................... | H01L 23/427 165/104.26 |
| 9,054,659 B2 * | 6/2015 | Beale | ...................... | H01L 23/36 |
| 2002/0067599 A1 * | 6/2002 | Mann | .................. | H01L 23/3672 361/704 |
| 2003/0227067 A1 * | 12/2003 | Wienand | ................ | G01K 7/183 257/467 |
| 2004/0052051 A1 * | 3/2004 | Malone | .................. | F28D 15/02 361/700 |
| 2008/0144286 A1 * | 6/2008 | Li | ....................... | H01L 23/4006 361/701 |
| 2009/0223647 A1 * | 9/2009 | Alousi | ................ | F28D 15/0233 165/80.3 |
| 2010/0254426 A1 * | 10/2010 | Okamoto | ................. | G01K 1/14 374/141 |

FOREIGN PATENT DOCUMENTS

| | | |
|---|---|---|
| JP | 9-283958 | 10/1997 |
| JP | 2010-232519 | 10/2010 |

* cited by examiner

… (1 / 8) …

HEAT SINK AND ELECTRONIC APPARATUS PROVIDED WITH HEAT SINK

CROSS-REFERENCE TO RELATED APPLICATION

This application claims priority from, and incorporates by reference the entire disclosure of, Japanese Patent Application No. 2012-172883, filed on Aug. 3, 2012.

FIELD

The present application relates to a heat sink which is placed on a heat generating component to prevent a rise in temperature of the heat generating component and to an electronic apparatus provided with that heat sink.

BACKGROUND

In the past, the semiconductor, in particular a CPU package, which was provided at the inside of an electronic apparatus would generate heat during operation and become high in temperature, so a heat sink was attached to prevent an excessive rise in temperature. The heat sinks up to now have been formed from aluminum and other metal materials with a good heat conductivity. Ones comprised of base members, which are placed on the heat generating member, on which large numbers of heat dissipating fins are provided sticking out at predetermined intervals have been the mainstream.

On the other hand, if electronic apparatuses become higher in performance and the amount of heat generated by the semiconductor packages increases, the heat dissipating efficiency of the heat sinks would have to be improved, or else a rise in the temperature of the semiconductor package could no longer be prevented. For this reason, apparatuses have appeared in which a Peltier device which utilizes the Peltier effect is attached at the bottom of the base member of the heat generator and a DC current is run to the Peltier device to control the cooling performance of the heat sink. Furthermore, a heat sink of a type which provides an independent temperature monitor inside of the heat sink for the purpose of detecting the surface temperature of the semiconductor package is disclosed in Japanese Laid-Open Patent Publication No. 2010-232519.

In this regard, in recent years, along with the higher operating frequencies of LSI's (large scale integrated circuits), there have been more severer instantaneous changes in the operating current (load fluctuations). There has therefore been the issue that with conventional heat sinks, temperature control of the semiconductor package has not been possible. This is because conventional heat sinks are high in thermal resistance and narrow in cooling control range, so temperature control of the semiconductor package has not been possible. Further, if temperature control of the semiconductor package is not possible, at the time of a temperature test of a semiconductor package, it would be difficult to suppress self heat generation until the device destruction temperature. Further, if high speed temperature control is not able to be realized, the temperature test conditions (temperature, voltage, etc.) may be eased to run the tests, but there was the issue that it was not possible to eliminate the fault rate in the later steps. The reason why it was not possible to eliminate the fault rate in the later steps is that the temperature test may not be conducted under the "system test conditions".

SUMMARY

In one aspect, the present application, in consideration of this background, has as its object the provision of a structure which deals with the heat generation temperature at a semiconductor package or other such heat generating member with large temperature changes so as to thereby provide a heat sink with a wide cooling range and able to respond to cooling needs at a high speed. Further, it has as its object the provision of an electronic apparatus provided with a heat sink which has a broad cooling range and can respond to cooling needs at a high speed.

According to one aspect, there is provided a heat sink which is provided with a first cooling part which is placed on a heat generating member and which is provided with a first base member which absorbs heat of a peripheral edge part of a top surface side of the heat generating member, first fins which are provided sticking out on the top surface of the first base member, a recess which is formed at a bottom surface of the first base member, and a through hole which is formed in the recess and runs through to the top surface side and with a second cooling part which can be accommodated in the recess and which is provided with a second base member which absorbs heat of a center part of the top surface of the heat generating member, a slide member which is provided sticking out on the second base member and which runs through to the through hole, second fins which are provided sticking out on the front end side of the slide member, and a fluid path which is provided in the second base member and which causes coolant which is supplied from a water cooling mechanism to circulate.

DESCRIPTION OF EMBODIMENTS

Below, the attached drawings will be used to explain embodiments of the present application based on specific examples.

Figure 1A:
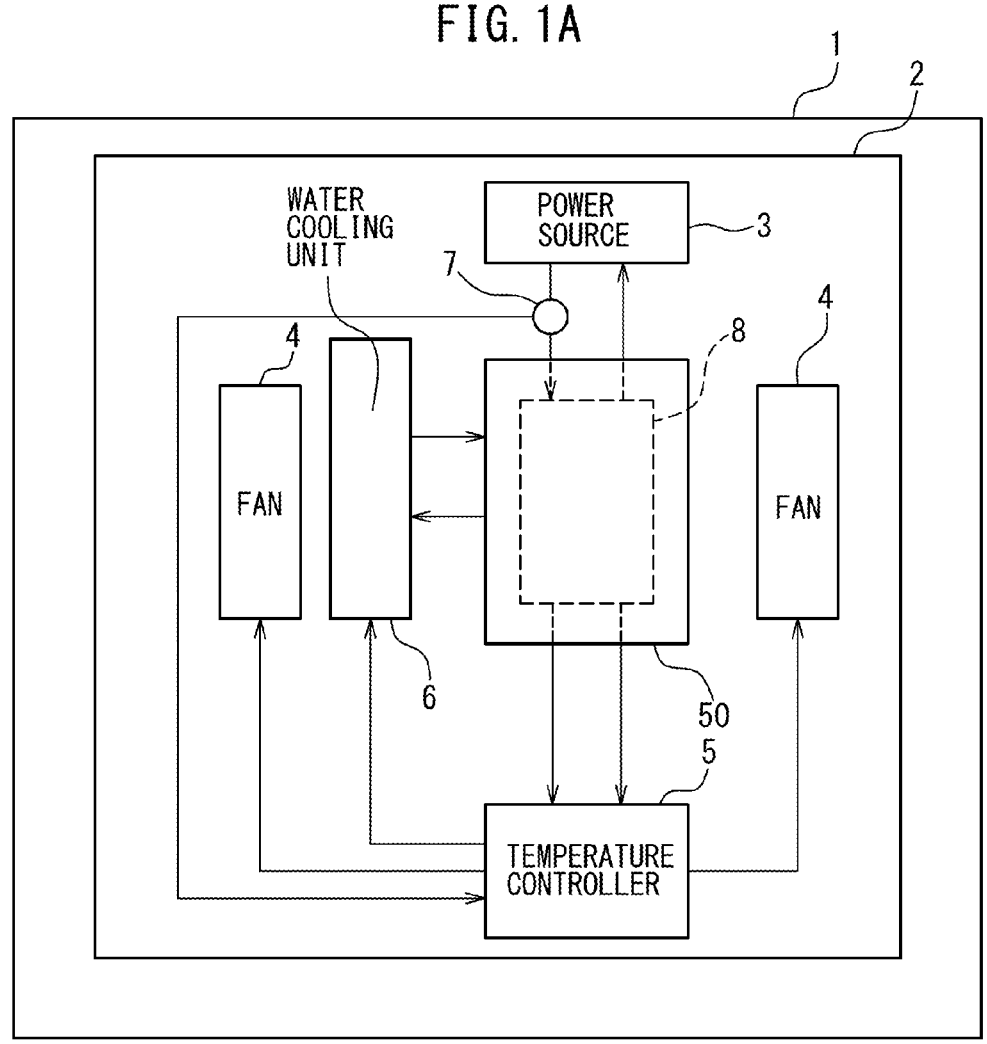
FIG. 1A is layout diagram which illustrates the configuration of circuit components which are carried at a unit which is carried in an electronic apparatus and the layout of the heat sink of the present application which cools circuit components which form heat generating members.

FIG. 1A is a layout diagram which illustrates the layout of circuit components which are mounted on a unit 2 which is mounted on an electronic apparatus 1 and a heat sink 50 which cools one of the circuit components which forms a heat generating member 8. The heat generating member 8 is for example a semiconductor package 8. On the unit 2, there are a power source 3 which supplies power to the semiconductor package 8 and a fan 4 for cooling the semiconductor package 8. The heat sink 50 of the present application includes a fluid path through which cooling water is circulated, so the unit 2 is provided with a water cooling unit 6.

The water cooling unit 6, the power source 3, and the temperature controller 5 may also be provided at the outside of the unit 2. Further, the unit 2 may be provided with a temperature controller 5 which controls the fan 4 and the water cooling unit 6. Furthermore, the power feed circuit from the power source 3 to the semiconductor package 8 is provided with a current sensor 7 which detects a current which flows through the circuit. The detection value of the current sensor 7 is input to the temperature controller 5. The electronic apparatus 1 is not particularly limited in type.

Figure 1B:
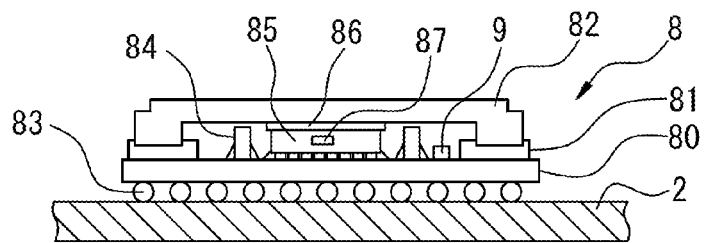
FIG. 1B is a cross-sectional view which illustrates one example of the structure of the inside of the heat generating member formed by the semiconductor package which is illustrated in FIG. 1A.

FIG. 1B is a cross-sectional view which illustrates an example of the structure of the inside of the semiconductor package (heat generating member) 8 which is illustrated in FIG. 1A. The semiconductor package 8 is comprised of a base board 80 on which a semiconductor chip 85, capacitor 84, thermistor 9, etc. are mounted. These components are covered by a frame 81 and a cover 82. Further, the circuit on the base board 80 is connected to the circuit on the unit 2 by solder balls 83. Further, between the top surface of the semiconductor chip 85 and the bottom surface of the cover 82, a heat bonding material 86 is provided. Furthermore, the semiconductor chip 85, in this example, has a built-in thermal diode 87. The thermistor 9 and the thermal diode 87 detect the temperature of the semiconductor package 8. These temperature detection values are input to the temperature controller 5 which is illustrated in FIG. 1A.

The thermistor 9 and the thermal diode 87 both detect the temperature. The thermistor 9 can easily directly convert thermal resistance to temperature. On the other hand, the thermal diode 87 is positioned near the heat generating member, so a reliable temperature value is found, but finding the temperature value required a calculation formula and was not easy. Further, depending on the semiconductor package, sometimes there are both a thermistor 9 and a thermal diode 87 and sometimes one of them is omitted. Therefore, in accordance with the state of the semiconductor package, both the thermistor 9 and the thermal diode 87 are used or either of them is used.

Figure 2:
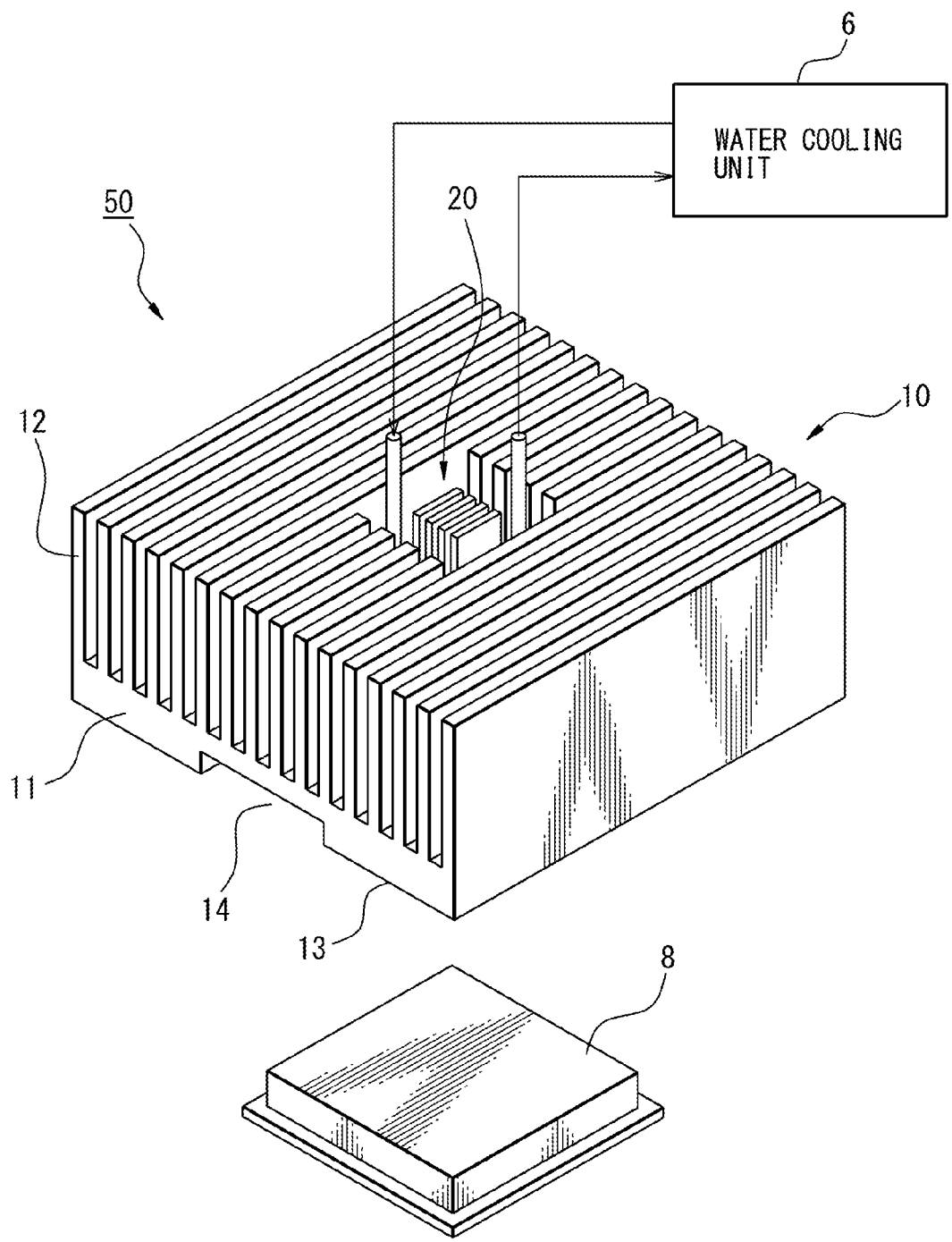
FIG. 2 is a perspective view which illustrates the appearance of a heat sink of a first embodiment of the present application and a heat generating member to which the heat sink is attached.

First, using FIG. 2 and FIG. 3, the configuration of a first embodiment of the heat sink 50 which is attached on the semiconductor package 8 which is illustrated in FIG. 1A will be explained. FIG. 2 is a perspective view which illustrates the appearance of the heat sink 50 which is illustrated in FIG. 1A as seen from above, FIG. 3A is a disassembled perspective view of the heat sink 50 which is disassembled as seen from below, and FIG. 3B is a perspective view which views one part of the heat sink 50 which is illustrated in FIG. 3A from above.

As illustrated in FIG. 2, the heat sink 50 of the present application is provided with a first cooling part 10 which cools the peripheral edge part of the semiconductor package 8 and a second cooling part 20 which cools the center part of the semiconductor package 8. The first cooling part 10 is comprised of a first base member 11 on which a plurality of first fins 12 are provided sticking out. The first fins 12 are provided a predetermined intervals in parallel to the direction of flow of the cooling air explained later. The center part of the first cooling part 10 has a part with no first fins 12. The second cooling part 20 is provided at this part. At the bottom surface 13 of the first base member 11 of this embodiment, a recess 14 is provided. This recess 14 extends in the same direction as the direction of provision of the first fins 12 from one end face of the first base member 11 to the end face at the opposite side. The recess 14 can also be provided just at the center part of the bottom surface 13 of the first base member 11. This example is illustrated in FIG. 3A.

Figures 3A, 3B:
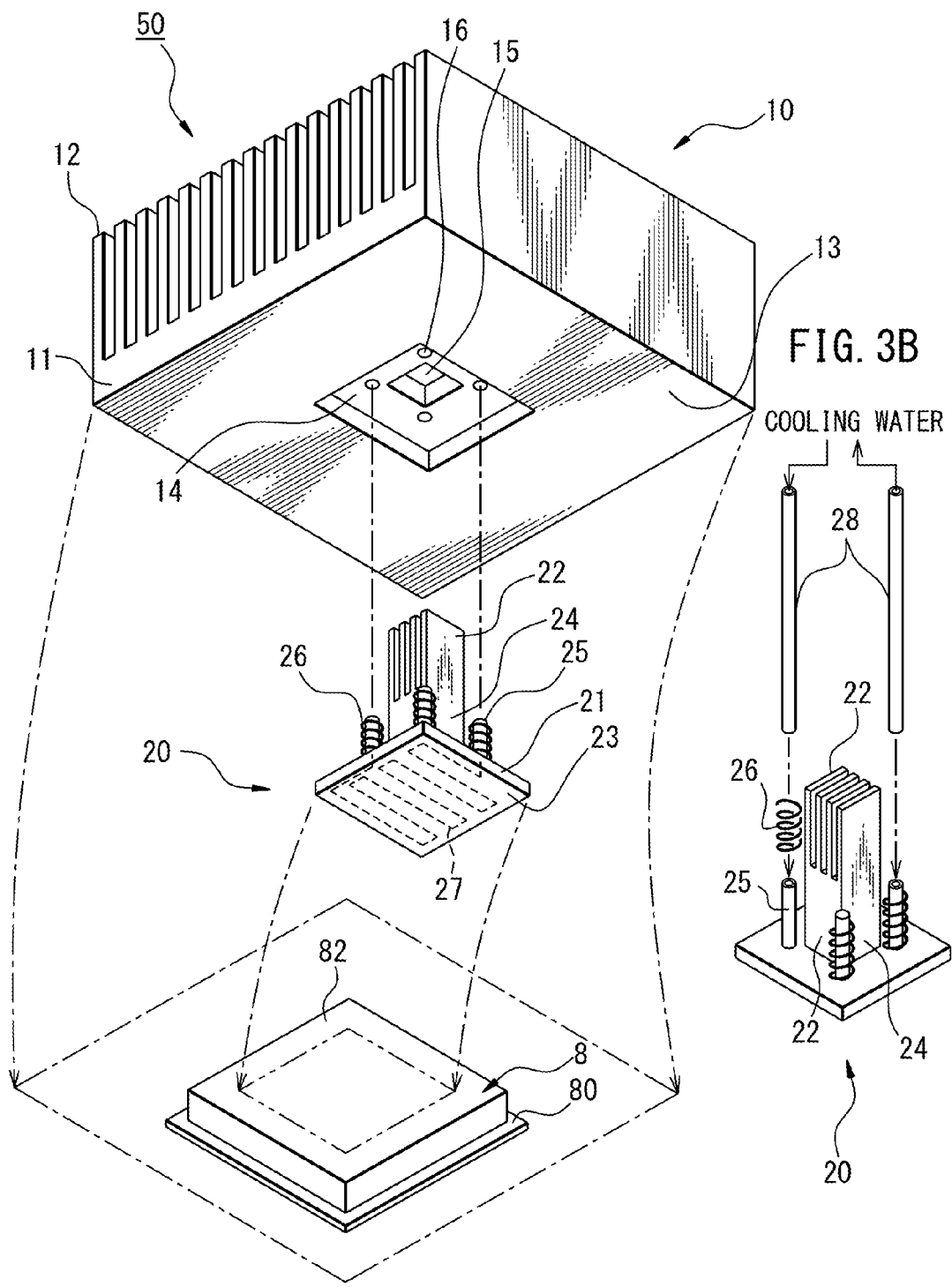
FIG. 3A is a disassembled perspective view which illustrates the configuration of a heat sink of a first embodiment of the present application and a position of attachment to a heat generating member.
FIG. 3B is a perspective view which illustrates the configuration of a second cooling part which is illustrated in FIG. 3A.

In the embodiment which is illustrated in FIG. 3A, the center part of the bottom surface 13 of the first base member 11 is provided with the recess 14. This recess 14 is of a size which is able to accommodate a second base member 21 of the second cooling part 20. In the recess 14, there are a through hole 15 which runs through the first base member 11 and guide holes 16 which are provided around the through hole 15. The second cooling part 20 is attached to the through hole 15 and the guide holes 16. In the first embodiment, the through hole 15 is rectangular in shape, while the guide holes 16 are circular holes. Four of them are provided.

The second cooling part 20 is provided with the second base member 21 at the inside of which a fluid path which forms a cooling water passage 27 is provided and a slide member 24 and guide members 25 which are provided on the second base member 21. The slide member 24 is shaped to enable it to be inserted through the above-mentioned through hole 15. At the top surface of the slide member 24, second fins 22 are provided sticking out in the same direction as the first fins 12. The guide members 25 are shaped to enable them to be inserted through the above-mentioned guide holes 16. Further, two of the four guide members 25 are pipes through which cooling water runs and are respectively connected to an inlet part and an outlet part of cooling water of the cooling water passage 27 which are provided at the second base member 21.

Furthermore, around the guide members 25, as illustrated in FIG. 3B, elastic members constituted by springs 26 are attached. Further, at the guide members 25 which are communicated with the cooling water passage 27 which is provided at the second base member 21, connecting pipes 28 which are connected to the water cooling unit 6 which is explained in FIG. 1A and carry the cooling water are attached. The four guide members 25 are inserted through the guide holes 16 which are provided at the recess 14. The front ends of the two guide members 25 to which the connecting pipes 28 are not connected have locking members 29 (see FIG. 10) attached to them which prevent detachment of the guide members 25 from the guide holes 16 after insertion through the guide holes 16. The front ends of the guide members 25 to which the connecting pipes 28 are attached may also have locking members attached to them. Due to these locking members, the second cooling part 20 is held in a state hanging down from the recess 14 of the first base member 11.

The region which is surrounded by the two-dot chain line which is drawn on the cover 82 of the semiconductor package 8 which is illustrated in FIG. 3A is the part to which the second base member 21 is attached, while the region which is surrounded by the one-dot chain line which is drawn at the outside of the semiconductor package 8 illustrates the part at which the first base member 11 is positioned. Note that, in the figure, the second base member 21 is drawn exaggerated in size. The region which is illustrated by the two-dot chain line which is drawn on the cover 82 of the semiconductor package 8 is a region which is actually a bit smaller.

Figure 4A:
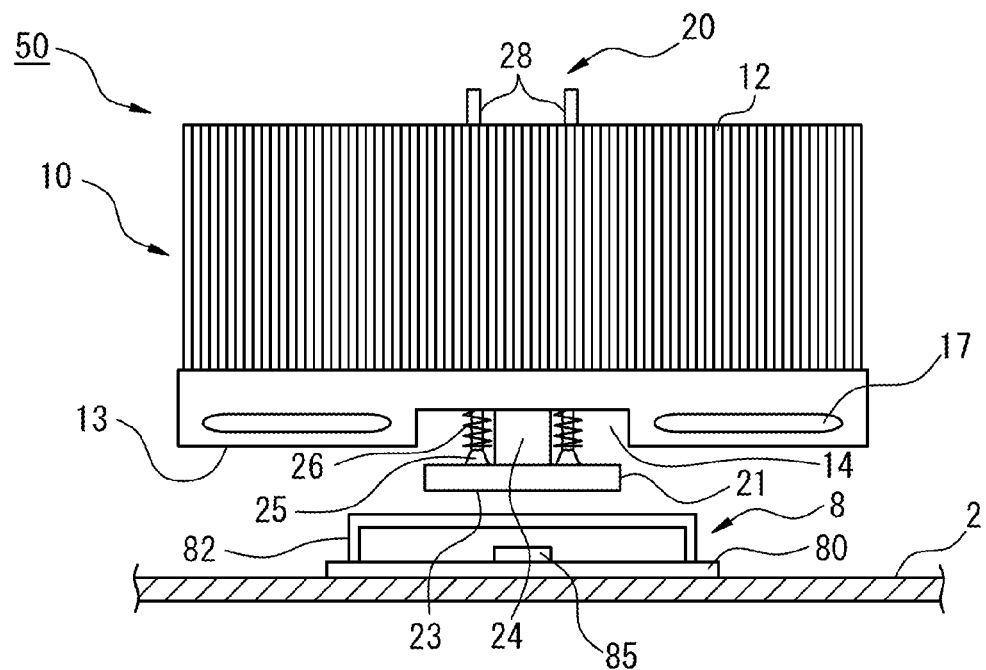
FIG. 4A is a side view which illustrates the state before attachment of a heat sink of a first embodiment of the present application to a heat generating member.

The bottom surface 23 of the second base member 21 of the second cooling part 20 in the state hanging down from the recess 14 of the first base member 11 sticks out downward from the bottom surface 13 of the first base member 11 in the state before being attached to the semiconductor package 8, as illustrated in FIG. 4A. This is because the springs 26 which are attached around the guide members 25 bias the second base member 21 so as to move away from the recess 14. Note that, the heat sink 50 which is illustrated in FIG. 4A is provided with a heat dispersing part 17 in the first base member 11. The heat dispersing part 17 may be a simple space, but inserting in the heat dispersing part 17 a cooling part of a heat pipe which conveys heat to another location enables the cooling efficiency to be raised. The structure of a heat pipe which is comprised of a cooling part and a heating pipe which are connected by a container is known, so further explanation will be omitted.

Figure 4B:
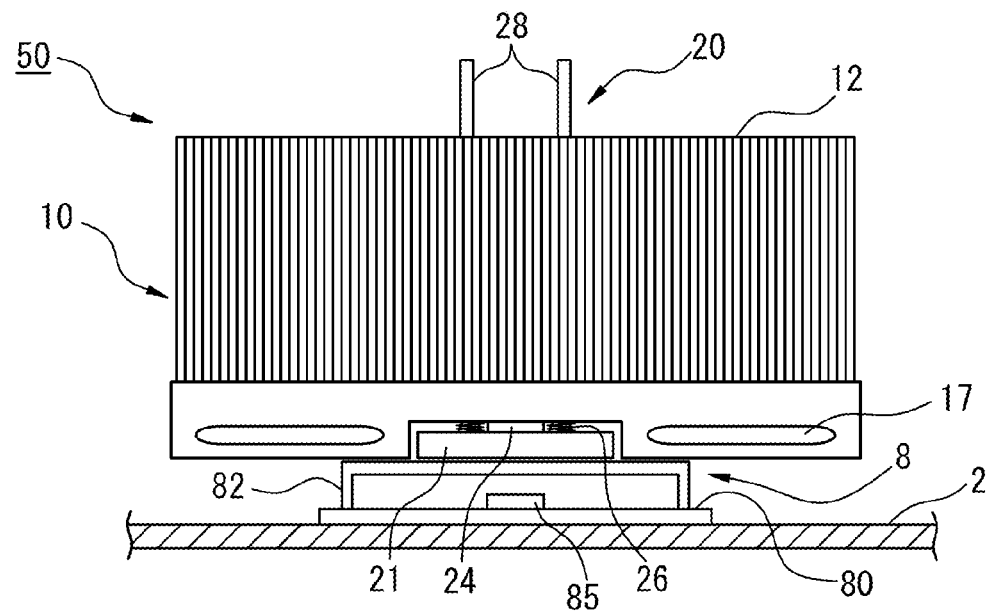
FIG. 4B is a side view which illustrates the state after attachment of a heat sink of a first embodiment of the present application to a heat generating member.

FIG. 4B illustrates the state where the heat sink 50 of the first embodiment which is illustrated in FIG. 4A is attached on the semiconductor package 8. If placing the heat sink 50 on the semiconductor package 8, the springs 26 around the guide members 25 contract and the slide member 24 moves through the through hole whereby the second base member 21 is accommodated inside of the recess 14. Further, in the state where the heat sink 50 is attached on the semiconductor package 8, the second base member 21 is completely accommodated inside of the recess 14, and the bottom surface 23 of the second base member 21 becomes the same plane as the bottom surface of the first base member 11. That is, the bottom surface 23 of the second base member 21 becomes positioned on the same plane as the bottom surface 13 of the first base member 11.

Figure 5:
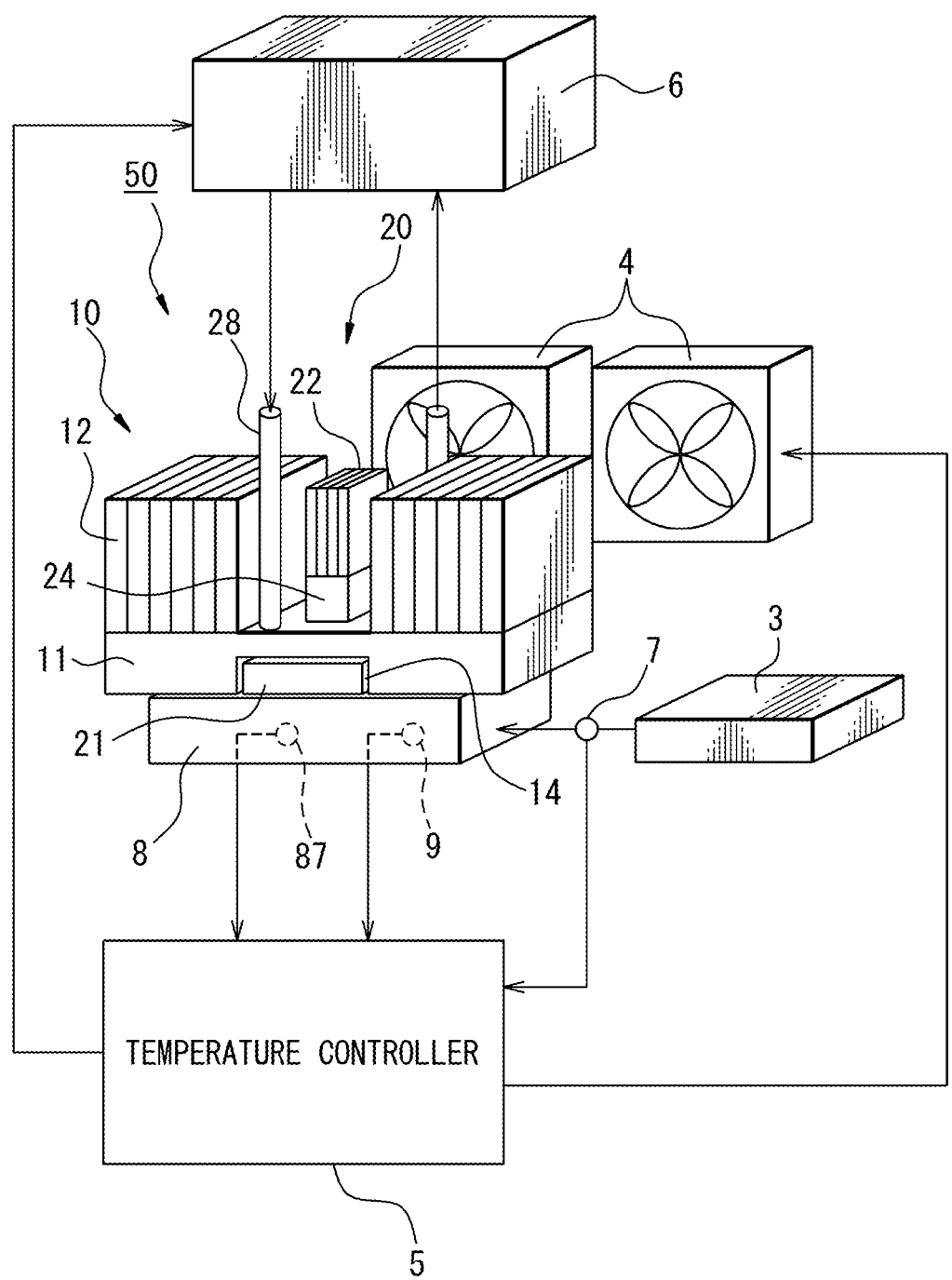
FIG. 5 is a system diagram which explains an environment in which a first cooling part and a second cooling part which are provided at a heat sink of a first embodiment of the present application are made to operate.

FIG. 5 is a system diagram which explains the environment in which the first cooling part 10 and the second cooling part 20 which are provided at the heat sink 50 of the first embodiment are made to operate. The first cooling part 10 and the second cooling part 20 of the heat sink 50 of the first embodiment which are explained from FIG. 2 to FIG. 4 are drawn schematically in this figure. Further, the first fins 12 at the fan 4 side and opposite side of the slide member 24 are removed to facilitate understanding of the presence of the second cooling part 20. Furthermore, to clarify the presence of the recess 14, the recess 14 is extended to the end of the first base member 11.

The first cooling part 10 is an air-cooling type cooling part which uses the cooling air from the fan 4. The rotational speed of the fan 4 is controlled by the temperature controller 5 in accordance with the temperature at the inside of the semiconductor package 8 which is detected by the thermistor 9 or thermal diode 87 which is provided inside the semiconductor package 8. The second cooling part 20 is a water cooling type cooling part which uses cooling water from the water cooling unit 6. The amount of the cooling water which is discharged from the water cooling unit 6 is controlled by the temperature controller 5 in accordance with the detection value of the change in current which is fed from the power source 3 to the semiconductor package 8 which is detected by the current sensor 7.

In the semiconductor package 8, the vicinity of the center part where the semiconductor chip 85 is provided is the high heat generating surface. The temperature in the vicinity of the peripheral edge part is not as high as the temperature of the high heat generating surface. Further, the change in temperature of the semiconductor package 8 can be detected with better response and at a higher speed when detecting the change of operating current from the power source 3 by the current sensor 7 than when detecting it by the thermistor 9 or thermal diode 87 or other temperature sensor. Therefore, in the present application, the heat sink 50 is provided with the first cooling part 10 and the second cooling part 20, the first cooling part 10 is made to cool the peripheral edge part of the semiconductor package 8 at a low speed, and the second cooling part 20 is made to cool the center part of the semiconductor package 8 at a high speed.

That is, the first cooling part 10 controls cooling in accordance with the change of temperature of the semiconductor package 8, while the second cooling part 20 controls the cooling of the semiconductor package 8 in accordance with the change of the operating current of the semiconductor package 8 at a higher speed than the first cooling part 10 (load fluctuating frequency or more). For example, the low speed control period is a period of N times the high speed control period (N=5 to 20). For this cooling control, PID control etc. can be used. Further, the first cooling part 10 cools the semiconductor package 8 mainly by air cooling at a low speed, while the second cooling part 20 cools the semiconductor package 8 by water cooling at a high speed. For this reason, there is no interference of heat between the cooling sources and the cooling loss can be kept down to a minimum.

Here, an example of the low speed cooling control and the high speed cooling control of the first cooling part 10 and the second cooling part 20 of the heat sink 50 by the temperature controller 5 which is illustrated in FIG. 5 will be explained using the flow charts from FIG. 6 to FIG. 9. Note that, as the cooling control, for example, the explanation will be given with reference to the example of a heat sink 50 which is used for a temperature test of a semiconductor package 8. The temperature test of the semiconductor package 8 is performed within a predetermined time, so when this predetermined time elapses, the cooling control is also ended.

Figure 6A:
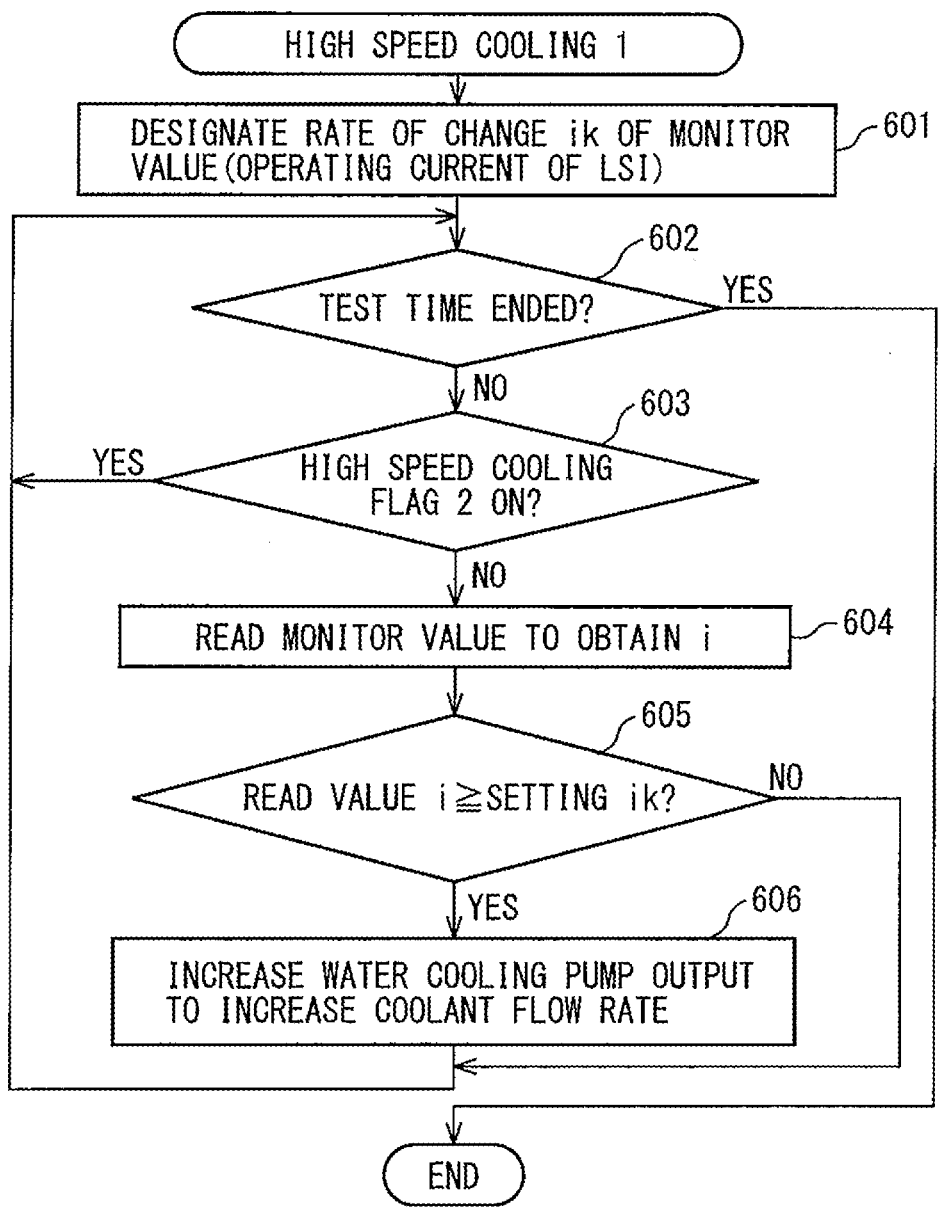
FIG. 6A is a flow chart which illustrates a first embodiment of control which a temperature controller which is illustrated in FIG. 5 performs with respect to the second cooling part.

FIG. 6A is a flow chart which illustrates a first embodiment of high speed cooling control (high speed cooling 1) which is performed by the temperature controller 5 which is illustrated in FIG. 5 on the second cooling part 20. First, at step 601, the rate of change "ik" of the operating current of the semiconductor chip (LSI) constituting a monitor value is designated. At the next step 602, it is judged if the time of the temperature test of the semiconductor package 8 has ended. If the test time has ended (YES), this routine ends, but if it has not ended (NO), the routine proceeds to step 603.

At step 603, it is judged if the later explained high speed cooling flag 2 is on. If the high speed cooling flag 2 is on (YES), the routine returns to step 602, while if the high speed cooling flag 2 is off (NO), the routine proceeds to step 604. At step 604, the monitor value of the current from the current sensor 7 is read and is made "i". Further, at step 605, it is judged if the read value "i" is a setting "ik" or more. If the judgment of step 605 is (read value "i"<setting "ik") (NO), the routine returns to step 602, while if (read value "i"≥setting "ik") (YES), the routine proceeds to step 606.

At step 606, the amount of discharge of the water cooling unit is increased and the amount of cooling water which flows through the second cooling part 20 of the heat sink 50 is increased (at step 606, the output of the water cooling pump is increased to increase the amount of cooling water). That is, when the current detection value by the current sensor 7 is large, the temperature of the semiconductor package 8 rises. By increasing the amount of cooling water which flows through the second cooling part 20 of the heat sink 50, the semiconductor package 8 is strongly cooled.

Figure 7:
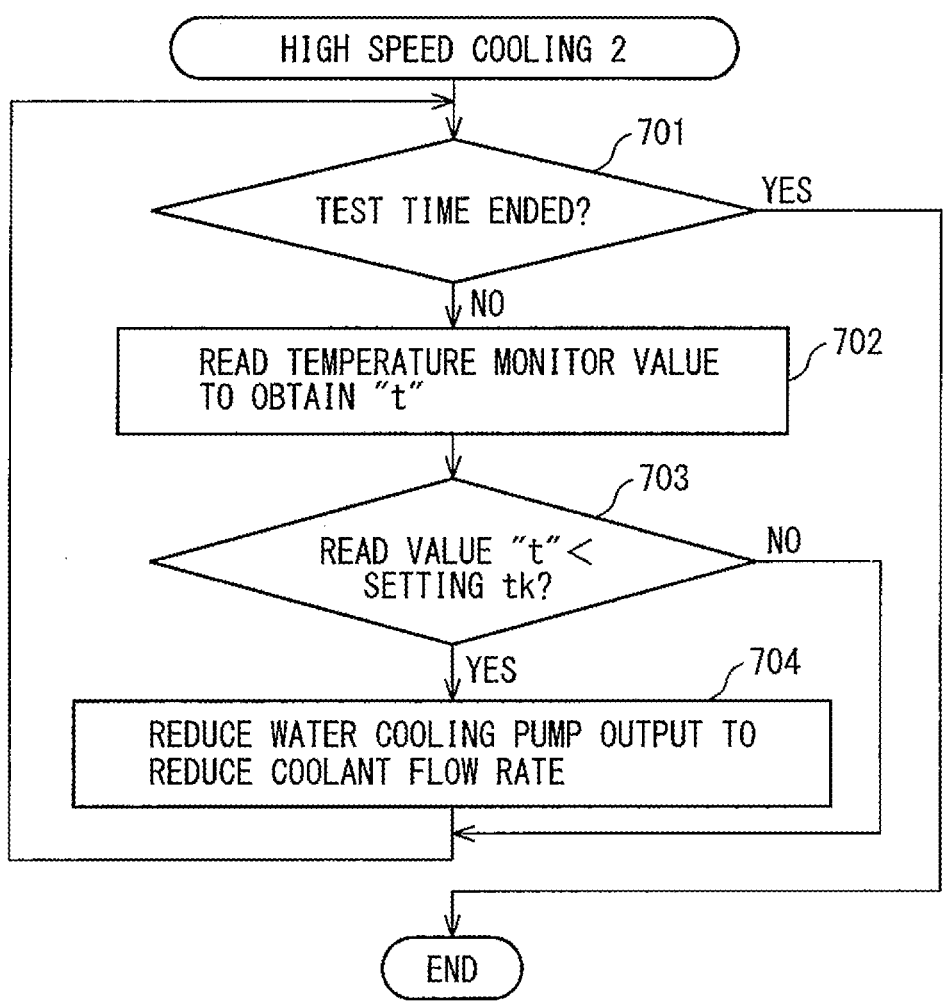
FIG. 7 is a flow chart which illustrates control which a temperature controller which is illustrated in FIG. 5 performs with respect to the second cooling part in which the amount of discharge of a water cooling unit is lowered.

FIG. 7 is a flow chart which explains, in contrast to the high speed cooling 1 which increased the amount of discharge of the water cooling unit which was explained in FIG. 6A, control which lowers the amount of discharge of the water cooling unit (high speed cooling 2). First, at step 701, it is judged if the time of the temperature test of the semiconductor package 8 has ended. If the test time has ended (YES), this routine ends, but if it has not ended (NO), the routine proceeds to step 702.

At step 702, the monitor value of the current from the current sensor 7 is read and is made "t". Further, at step 703, it is judged if the read value "t" is less than a setting "tk". If the judgment of step 703 is (read value "t"<setting "tk") (YES), the routine proceeds to step 704, while if (read value "t"≥setting "tk") (NO), the routine returns to step 701.

At step 704, the amount of discharge of the water cooling unit is decreased and the amount of cooling water which flows through the second cooling part 20 of the heat sink 50 is decreased (at step 704, the output of the water cooling pump is decreased to decrease the amount of cooling water). That is, when the current detection value by the current sensor 7 is small, the temperature of the semiconductor package 8 falls. By decreasing the amount of cooling water which flows through the second cooling part 20 of the heat sink 50, the cooling of the semiconductor package 8 is reduced.

Figure 6B:
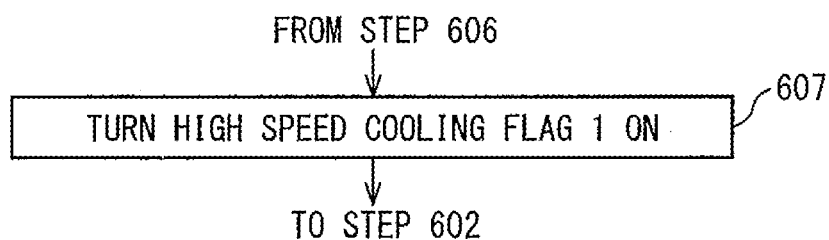
FIG. 6B is a partial flow chart which illustrates a second embodiment of control which a temperature controller which is illustrated in FIG. 5 performs with respect to the second cooling part.

FIG. 6B is a flow chart which illustrates a second embodiment of high speed cooling control which the temperature controller 5 which is illustrated in FIG. 5 performs with respect to the second cooling part 20. The second embodiment differs from the first embodiment only on the point of the addition of step 607 after step 606, so the description of parts other than step 607 will be omitted. At step 607, the high speed cooling flag 1 is turned on and the routine returns to step 602. The control of this step 607 will be explained later, but it is performed simultaneously with the second embodiment of the low speed cooling control which the temperature controller 5 performs with respect to the first cooling part 10 (low speed cooling 2).

Figure 8:
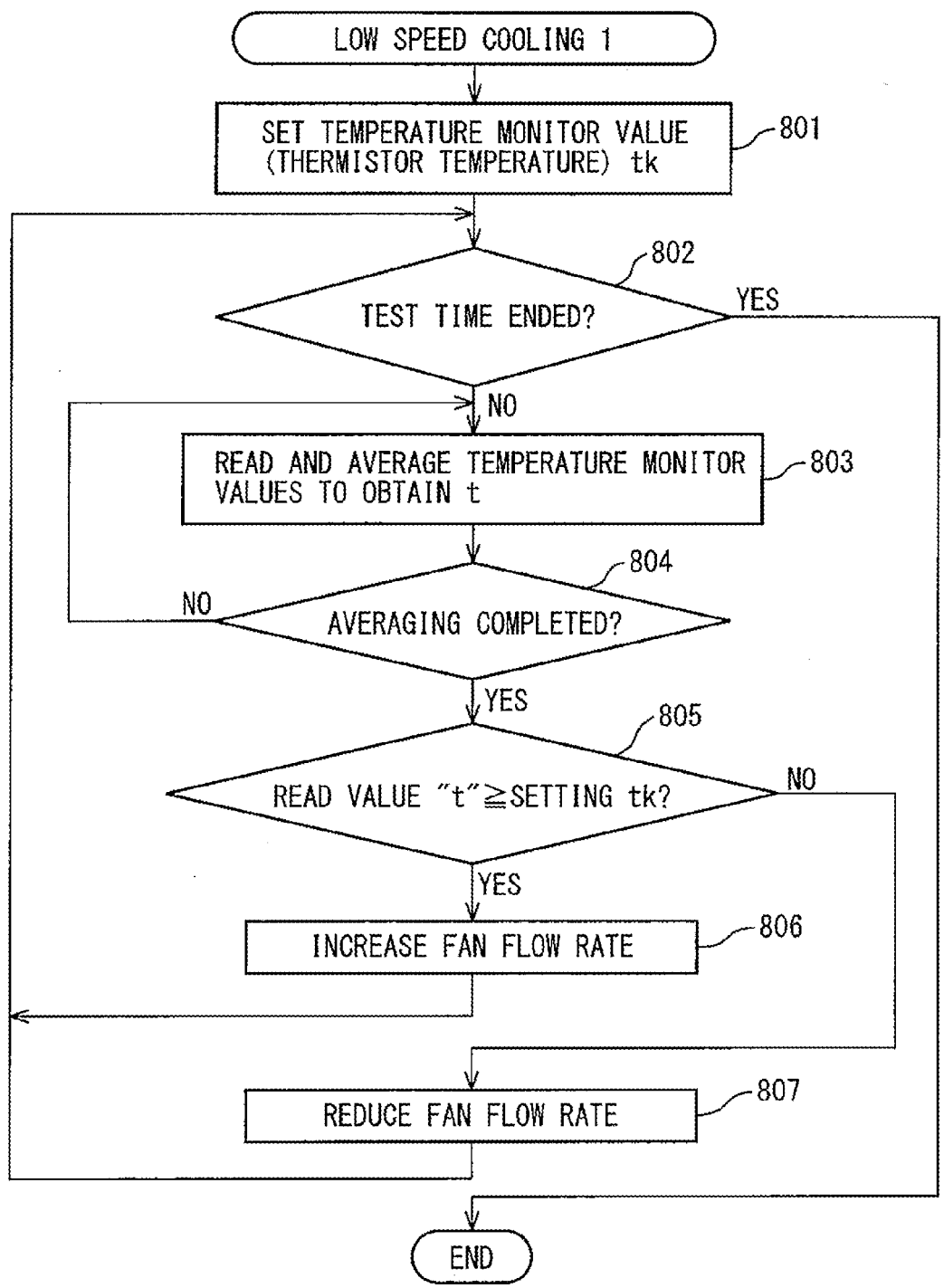
FIG. 8 is a flow chart which illustrates control which a temperature controller which is illustrated in FIG. 5 performs with respect to the first cooling part.

FIG. 8 is a flow chart which illustrates a first embodiment of low speed cooling control which the temperature controller 5 which is illustrated in FIG. 5 performs with respect to the first cooling part 10 (low speed cooling 1). First, at step 801, the rate of change "tk" of the temperature detection value of the thermistor which measures the temperature of the semiconductor package which forms a monitor value is designated. At the next step 802, it is judged if the time of the temperature test of the semiconductor package 8 has ended. If the test time has ended (YES), this routine ends, but if it has not ended (NO), the routine proceeds to step 803.

At step 803, the monitor value of the temperature is read out from the thermistor 9 and several monitor values are averaged and the result made "t". At the next step 804, it is judged if the averaging has been completed. If completed (YES), the routine proceeds to step 805, while if not completed (NO), the routine returns to step 803 and the processing of step 803 is repeated.

At step 805, it is judged if the read value (average value) "t" is the setting "tk" or more. When the judgment of step 805 is (the read value "t"<setting "tk") (NO), the routine proceeds to step 807 where the flow rate of the fan is reduced then the routine returns to step 802. On the other hand, when the judgment of step 805 is the (read value "t"≥<setting "tk") (YES), the routine proceeds to step 806 where the flow rate of the fan is increased and the routine returns to step 802.

In the control of the low speed cooling 1 which the temperature controller 5 performs with respect to the first cooling part 10, at step 803, several monitor values of the temperature which the thermistor 9 detects are averaged and the result used as the read value "t". That is, the flow rate of the fan is not directly changed by the monitor value of the temperature which was read out from the thermistor 9. Rather, several monitor values are averaged and the average value is used to adjust the flow rate of the fan. Therefore, the period of cooling control at the first cooling part 10 is longer compared with the period of cooling control at the second cooling part 20 which adjusts the amount of cooling water immediately in accordance with the monitor value of the current sensor. In the first embodiment of low speed cooling control, for example, 10 monitor values are averaged and the average value is used to control the fan. The fan is controlled by a period of at least 10 times that of the high speed cooling.

Figure 9:
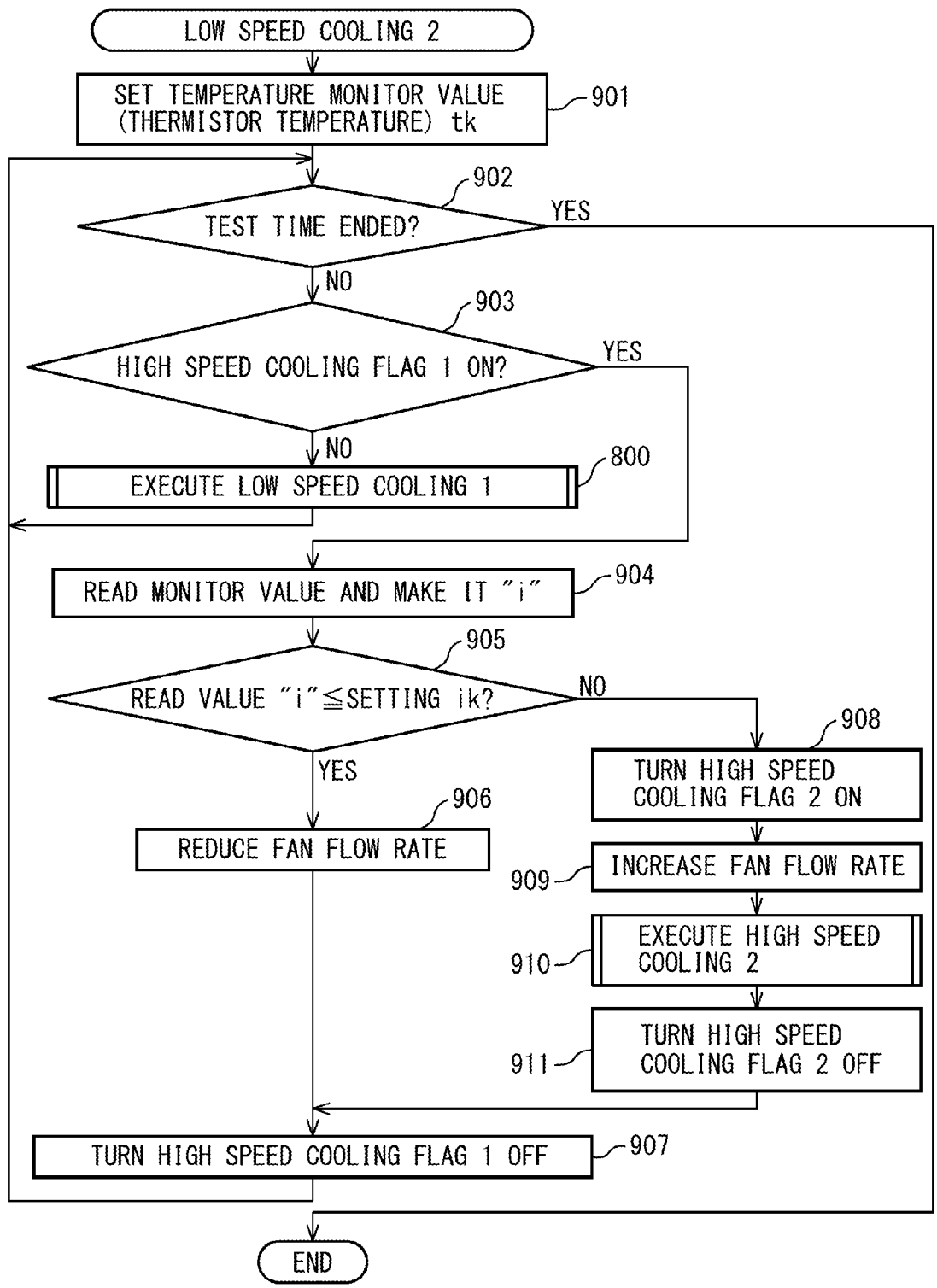
FIG. 9 is a flow chart which illustrates a second embodiment of control which a temperature controller which is illustrated in FIG. 5 performs with respect to the first cooling part and a flow chart which illustrates the second embodiment of control which a temperature controller which is illustrated in FIG. 6B performs with respect to the second cooling part.

FIG. 9 is a flow chart which illustrates a second embodiment of low speed cooling control (low speed cooling 2) which the temperature controller 5 which is illustrated in FIG. 5 performs with respect to the first cooling part 10. The second embodiment of low speed cooling control (low speed cooling 2) which the temperature controller 5 performs with respect to the first cooling part 10 is performed at the same time as the second embodiment of high speed cooling control which the temperature controller 5 performs with respect to the second cooling part 20.

First, at step 901, the rate of change "tk" of the temperature detection value of the thermistor which measures the temperature of the semiconductor package which forms a monitor value is designated. At the next step 902, it is judged if the time of the temperature test of the semiconductor package 8 has ended. If the test time has ended (YES), this routine ends, but if it has not ended (NO), the routine proceeds to step 903.

At step 903, it is judged if the high speed cooling flag 1 is on. The high speed cooling flag 1 is turned on at step 607 of the second embodiment of high speed cooling control which the temperature controller 5 which was explained in FIG. 6B performs with respect to the second cooling part 20. Further, when the high speed cooling control flag 1 is on (YES), the routine proceeds to step 904, while when it is not on (NO), the routine proceeds to step 800. At step 800, step 803 to step 807 of the control of the first embodiment of low speed cooling control (low speed cooling 1) which the temperature controller 5 which was explained in FIG. 8 performs with respect to the first cooling part 10 are executed and the routine returns to step 902.

On the other hand, at step 904 which the routine proceeds to when the high speed cooling control flag is on, the monitor value of the current from the current sensor 7 is read out and is used as "i". Further, at step 905, it is judged if the read value "i" is the setting "ik" or less. When the judgment of step 905 is (read value "i">setting "ik") (NO), the routine proceeds to step 908, while when it is (read value "i"≧setting "ik") (YES), the routine proceeds to step 906.

When the routine proceeds to step 906, the monitor value "i" of the current from the current sensor 7 is the setting "ik" or less and the temperature of the semiconductor package 8 has fallen. Therefore, in this case, at step 906, the flow rate of the fan is reduced and, at the next step 907, the high speed cooling flag 1 is turned off and the routine returns to step 902. On the other hand, when the routine proceeds to step 908, the monitor value "i" of the current from the current sensor 7 is larger than the setting "ik" and the temperature of the semiconductor package 8 is high.

Therefore, in this case, to prevent the high speed cooling 1 from operating, at step 908, the high speed cooling flag 2 is set to the on state. After that, at step 909, the flow rate of the fan is increased and the routine proceeds to step 910. At step 910, the high speed cooling 2 which was explained in FIG. 7 is executed. When the high speed cooling 2 is completed, the routine proceeds to step 911. At step 911, the high speed cooling flag 2 is turned off, then the routine proceeds to step 907.

This operation is performed since, when the read value "i" of the current is larger than the setting at the time of low speed cooling which operates at a period 5 to 20 times that of high speed cooling, the capacity of water cooling which is used in the high speed cooling (here, meaning the amount of heat which can be cooled) is insufficient. That is, when the capacity of water cooling is insufficient, the flow rate of the fan which can cool a large amount of heat is increased to raise the overall cooling capacity. After this, the temperature is monitored by a high speed period and the cooling ability of the water cooling part is adjusted to obtain the desired temperature.

In this control, by increasing the flow rate of the fan, the second cooling part 20 is also struck by a large amount of cooling air from the fan, so even if reducing the amount of discharge of cooling water from the water cooling unit 6, high speed cooling at the second cooling part 20 can be performed.

Note that the example of low speed cooling control and high speed cooling control which use the first and second cooling parts 10 and 20 of the heat sink 50 which was explained above is just one illustration. The cooling control for independently controlling the first and second cooling parts 10 and 20 in accordance with the rise of temperature of the semiconductor package 8 is not limited to this embodiment.

Figure 10:
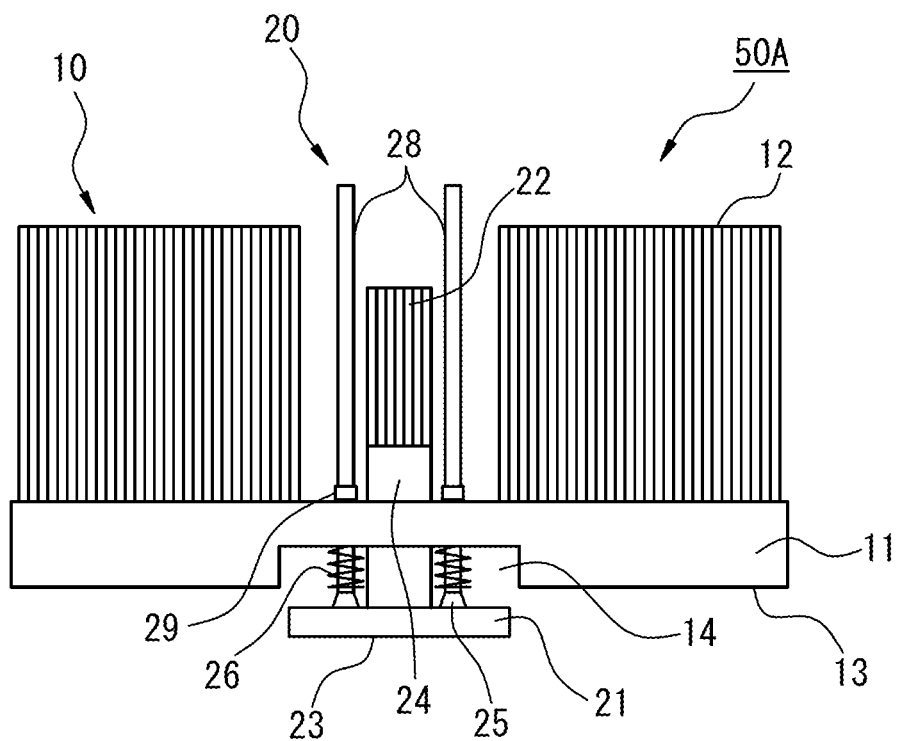
FIG. 10 is a side view which illustrates the structure of a heat sink of a second embodiment of the present application.

FIG. 10 is a side view which illustrates the structure of a heat sink 50A of a second embodiment of the present application. The heat sink 50A of the second embodiment differs from the first embodiment on the point that the first fins 12 are removed from the surface of the first base member 11 at the upstream side and the downstream side of the slide member 24 in the direction of flow of the cooling air. The rest of the configuration of the heat sink 50A of the second embodiment is the same as the heat sink 50 of the first embodiment, so the same component members will be assigned the same reference notations and their explanations will be omitted.

Figure 11:
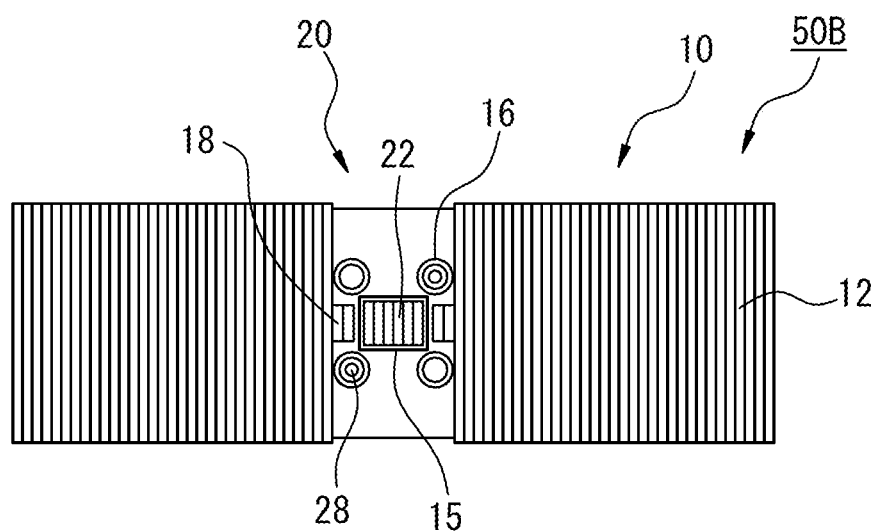
FIG. 11 is a plan view which illustrates the structure of a heat sink of a third embodiment of the present application.

FIG. 11 is a plan view which illustrates the structure of a heat sink 50B of a third embodiment of the present application. The heat sink 50B of the third embodiment is shaped as a rectangle, when viewed by a plan view, of a shorter length in the direction of flow of the cooling air compared with the heat sink 50A of the second embodiment. Further, auxiliary fins 18 are provided in the space between the slide member 24 and the first fins 12. This point is different from the heat sink 50A of the second embodiment. The rest of the configuration of the heat sink 50B of the third embodiment is the same as the heat sink 50A of the second embodiment, so the same component members are assigned the same reference notations and explanations therefore are omitted.

As explained above, the heat sink of the present application is characterized in that the heat sink is structurally formed from a high speed cooling part and a low speed cooling part, that is, two types of cooling parts, which are connected to mutually different cooling sources so as to enable independent cooling control. Due to this structure, there is no longer direct interference of heat between the cooling sources (movement or release) and the heat loss can be kept to a minimum, so the difference in capacities of the high speed cooling part and the low speed cooling part can be secured to the maximum extent.

As a result, the heat sink of the present application can be used for cooling a heat generating member with a partial high heat part and cool the high heat part by the high speed cooling part to thereby effectively prevent a rise in temperature of a heat generating member, in particular a semiconductor package, which easily experiences instantaneous fluctuations in load along with the higher operating frequencies of LSIs. That is, it is possible to control the temperature to within a set temperature range at a high speed without reaching the package destruction temperature of the semiconductor package.

Further, the high speed cooling part was explained in the above-mentioned embodiments as a water cooling system using cooling water and a mixed cooling system combining air cooling with the water cooling system, but as the cooling system for the high speed cooling part, there is also phase-changing cooling etc. For low speed cooling part, the air cooling system is sufficient. Further, the layout of the low speed cooling part and the high speed cooling part can be suitably changed in accordance with the position of the high heat part in the heat generating member. Furthermore, the heat sink of the present application enables a test of the heat generating circuit components in a state controlled at a high temperature such as 125° C., so the quality of the heat generating circuit component can be improved.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A heat sink which is provided with:
a first cooling part which is placed on a heat generating member and which is provided with a first base member which absorbs heat of a peripheral edge part of a top surface side of the heat generating member, first fins which are provided sticking out on the top surface of the first base member, a recess which is formed at a bottom surface of the first base member, and a through hole which is formed in the recess and runs through to the top surface side and
a second cooling part which can be accommodated in the recess and which is provided with a second base member which absorbs heat of a center part of the top surface of the heat generating member, a slide member which is provided sticking out on the second base member and which runs through to the through hole, second fins which are provided sticking out on the front end side of the slide member, and a fluid path which is provided in the second base member and which causes coolant which is supplied from a water cooling mechanism to circulate.

2. The heat sink according to claim 1, wherein
the second base member is attached in an elevatable manner with respect to the first base member through at least two guide members, and
first ends of two among the guide members are connected to an inlet part and outlet part of the fluid path and second ends are connected to the water cooling mechanism.

3. The heat sink according to claim 2, wherein
around the guide members between the recess and the second base member, elastic members are provided which bias the second base member in a direction moving away from the recess,
when the heat sink is placed on the heat generating member, the elastic members contracting and the bottom surfaces of the first and second base members becoming the same plane.

4. The heat sink according to claim 1, wherein
a heat dispersing part is provided positioned around the recess at the inside of the first base member.

5. The heat sink according to claim 4, wherein
a heat pipe is provided at the heat dispersing part.

6. The heat sink according to claim 1, wherein
the heat generating member is a semiconductor package which is placed on a unit,
a current sensor is provided at a circuit which carries current to the semiconductor package, and
a controller changes the amount of feed of coolant from the water cooling mechanism to the second base member in accordance with a current detection value of the current sensor.

7. The heat sink according to claim 6, wherein
a fan which supplies cooling air to at least the first cooling part is provided near the heat sink,
a temperature sensor which detects a temperature of the semiconductor package is provided at the semiconductor package, and
the controller drives the fan in accordance with a temperature detection value of the temperature sensor.

8. The heat sink according to claim 7, wherein
a detection period of a temperature detector of the temperature sensor is 10 times or more longer than a current detection period of the current sensor at the controller.

9. The heat sink according to claim 7, wherein
a detection period of a temperature detector of the temperature sensor is 5 to 20 times or more longer than a current detection period of the current sensor at the controller.

10. The heat sink according to claim 7, wherein
the first and second fins are provided sticking out on the first base member and the slide member in parallel to the direction of flow of cooling air from the fan.

11. The heat sink according to claim 10, wherein
a surface of the first base member at an upstream side and downstream side of the slide member in the direction of flow of the cooling air is a flat surface.

12. The heat sink according to claim 3, wherein
a heat dispersing part is provided positioned around the recess at the inside of the first base member.

13. The heat sink according to claim 12, wherein
a heat pipe is provided at the heat dispersing part.

14. The heat sink according to claim 13, wherein
the heat generating member is a semiconductor package which is placed on a unit,
a current sensor is provided at a circuit which carries current to the semiconductor package, and
a controller changes the amount of feed of coolant from the water cooling mechanism to the second base member in accordance with a current detection value of the current sensor.

15. The heat sink according to claim 14, wherein
a fan which supplies cooling air to at least the first cooling part is provided near the heat sink,
a temperature sensor which detects a temperature of the semiconductor package is provided at the semiconductor package, and
the controller drives the fan in accordance with a temperature detection value of the temperature sensor.

16. The heat sink according to claim 15, wherein
a detection period of a temperature detector of the temperature sensor is 10 times or more longer than a current detection period of the current sensor at the controller.

17. The heat sink according to claim 15, wherein
a detection period of a temperature detector of the temperature sensor is 5 to 20 times or more longer than a current detection period of the current sensor at the controller.

18. The heat sink according to claim 15, wherein
the first and second fins are provided sticking out on the first base member and the slide member in parallel to the direction of flow of cooling air from the fan.

19. The heat sink according to claim 18, wherein
a surface of the first base member at an upstream side and downstream side of the slide member in the direction of flow of the cooling air is a flat surface.

20. An electronic apparatus which contains a unit which houses inside it a heat generating member comprised of a semiconductor package, the semiconductor package having a heat sink attached to it, wherein
the heat sink is provided with:
a first cooling part which is placed on a heat generating member and which is provided with a first base member which absorbs heat of a peripheral edge part of a top surface side of the heat generating member, first fins which are provided sticking out on the top surface of the first base member, a recess which is formed at a bottom surface of the first base member, and a through hole which is formed in the recess and runs through to the top surface side and
a second cooling part which can be accommodated in the recess and which is provided with a second base member which absorbs heat of a center part of the top surface of the heat generating member, a slide member which is provided sticking out on the second base member and which runs through to the through hole, second fins which are provided sticking out on the front end side of the slide member, and a fluid path which is provided in the second base member and which causes coolant which is supplied from a water cooling mechanism to circulate.

* * * * *